(12) United States Patent
Kimoto et al.

(10) Patent No.: US 8,787,420 B2
(45) Date of Patent: Jul. 22, 2014

(54) INTEGRATED SEMICONDUCTOR LASER ELEMENT

(71) Applicant: Furukawa Electric Co., Ltd., Tokyo (JP)

(72) Inventors: Tatsuya Kimoto, Tokyo (JP); Go Kobayashi, Tokyo (JP); Toshikazu Mukaihara, Tokyo (JP)

(73) Assignee: Furukawa Electric Co., Ltd., Tokyo (JO)

( * ) Notice: Subject to any disclaimer, the term of this patent is extended or adjusted under 35 U.S.C. 154(b) by 0 days.

(21) Appl. No.: 13/960,429

(22) Filed: Aug. 6, 2013

(65) Prior Publication Data
US 2013/0315273 A1 Nov. 28, 2013

Related U.S. Application Data

(63) Continuation of application No. PCT/JP2012/077777, filed on Oct. 26, 2012.

(30) Foreign Application Priority Data

Nov. 7, 2011 (JP) ................................. 2011-243924

(51) Int. Cl.
*H01S 5/00* (2006.01)

(52) U.S. Cl.
USPC ................ 372/50.121; 372/50.22; 372/50.12; 372/50.1

(58) Field of Classification Search
USPC ....................... 372/50.121, 50.22, 50.12, 50.1
See application file for complete search history.

(56) References Cited

U.S. PATENT DOCUMENTS

| 7,112,827 B2 * | 9/2006 | Hayakawa et al. | ........... 257/116 |
| 8,457,169 B2 * | 6/2013 | Kimoto et al. | ............. 372/50.12 |
| 2005/0013330 A1 * | 1/2005 | Kish et al. | ........................ 372/26 |

FOREIGN PATENT DOCUMENTS

| JP | 2004-235600 | 8/2004 |
| JP | 2004-349692 | 12/2004 |
| JP | 2005-317695 | 11/2005 |
| JP | 2011-035060 | 2/2011 |
| JP | 2011-044581 | 3/2011 |

OTHER PUBLICATIONS

International Search Report issued on Feb. 5, 2013 for PCT/JP2012/077777 filed on Oct. 26, 2012 with English Translation.
International Written Opinion issued on Feb. 5, 2013 for PCT/JP2012/077777 filed on Oct. 26, 2012.

* cited by examiner

*Primary Examiner* — Kinam Park
(74) *Attorney, Agent, or Firm* — Oblon, Spivak, McClelland, Maier & Neustadt, L.L.P.

(57) ABSTRACT

Integrated are: semiconductor lasers of distributed feedback type that oscillate in single mode at emission wavelengths different from one another; a coupler that has as many input ports as the semiconductor lasers, the input ports to which output light from the semiconductor lasers are input, the coupler guiding and outputting the output light; and an amplifier that amplifies the output light from the coupler, and a predetermined relation holds true, where "N" is the number of the semiconductor lasers, "Ldfb" is a cavity length of each of the semiconductor lasers, "$\Delta v0$" is a spectral linewidth of laser light output therefrom, "Lsoa" is an amplifier length of the amplifier, "A" is an amplification factor of the amplifier, "$\Delta v$" is a spectral linewidth of amplified laser light output therefrom, and "R" is $\Delta v/\Delta v0$.

5 Claims, 5 Drawing Sheets

INTEGRATED SEMICONDUCTOR LASER ELEMENT

CROSS-REFERENCE TO RELATED APPLICATIONS

This application is a continuation of PCT International Application No. PCT/JP2012/077777 filed on Oct. 26, 2012, designating the United States, and claiming the benefit of priority from Japanese Patent Application No. 2011-243924 filed on Nov. 7, 2011. The entire contents of this PCT international application and this Japanese patent application are incorporated herein by reference.

BACKGROUND OF THE INVENTION

1. Field of the Invention

The present disclosure relates to an integrated semiconductor laser element integrated of a plurality of semiconductor lasers.

2. Description of the Related Art

As wavelength variable light sources for dense wavelength division multiplexing (DWDM) optical communications, for example, integrated semiconductor laser elements, each integrated of a plurality of semiconductor lasers having laser emission wavelengths different from one another have been disclosed (for example, see Japanese Patent Application Laid-open No. 2005-317695). In an integrated semiconductor laser element of this type, semiconductor lasers to be operated are switched to vary wavelength of laser light output, thereby functioning as a wavelength variable laser. To these semiconductor lasers, an optical coupler and a semiconductor optical amplifier (SOA) are sequentially connected. The laser light from the semiconductor laser to be operated passes through the optical coupler, and is thereafter optically amplified by the SOA and output from an output end of the element.

The integrated semiconductor laser element as described above is incorporated in a laser module with a pig-tail fiber for example, to be used. Such a laser module is used as a signal light source, in combination with an external modulator, for long-distance optical transmission in a DWDM optical communication network system for example.

As a signal light source or a local light source for a digital coherent transmission use at a transmission speed of 40, 100, or 400 Gbps, a wavelength variable laser that is capable of outputting laser light of high intensity and narrow linewidth is necessary. For example, in a general example, a light source used in transmission of a dual polarization quadrature phase shift keying (DP-QPSK) scheme at 100 Gbps requires an optical power intensity from a pig-tail fiber of a laser module to be 40 milliwatts or greater and a spectral linewidth to be 500 kHz or less. In another example, transmission of a dual polarization 16 quadrature amplitude modulation (DP-16QAM) scheme at 400 Gbps requires an optical power intensity from a pig-tail fiber of a laser module to be 40 milliwatts or greater and a spectral linewidth to be 100 kHz or less.

In the above-described integrated semiconductor laser element, in order to achieve narrow linewidth characteristics, generally, narrowing of the linewidth of the semiconductor lasers is performed. As such semiconductor lasers, a distributed feedback laser diode (DFB-LD) of single-mode oscillation and with a high yield rate is suitably used. To narrow linewidth of DFB lasers, values of coupling coefficients κ of diffraction gratings in the laser elements and cavity lengths of the DFB lasers (Ldfb) are increased. However, increasing the values of κ and Ldfb deteriorates side-mode suppression ratios (SMSR), and lowers probabilities of single-mode oscillation. It is thus preferable to keep κLdfb, which is a product of κ and Ldfb, down to about 1.5 or less. That is, preferable narrowing of linewidth of the DFB lasers is achieved by increasing Ldfb while keeping κLdfb to about 1.5. However, increasing the value of Ldfb lowers a current-to-light conversion efficiency. To compensate the lowering of the current-to-light conversion efficiency and obtain a desired optical power intensity from the integrated semiconductor laser element, there is a means to increase a driving current of the DFB lasers (first means), or a means to increase an amplification factor of the semiconductor optical amplifier (second means).

In the first means, the increase of the driving current is known to cause a phenomenon called spatial hole-burning within a laser cavity, resulting in widening of a spectral linewidth.

In the second means, a spectral linewidth of laser light output from a semiconductor laser in the integrated semiconductor laser element may be increased upon amplification by the semiconductor optical amplifier. In this case, the spectral linewidth of the laser light output from the integrated semiconductor laser element broadens than a desired linewidth.

Accordingly, there is a need to provide an integrated semiconductor laser element that is able to output laser light of a desired spectral linewidth and a desired optical intensity.

SUMMARY OF THE INVENTION

According to an aspect of the present invention, an integrated semiconductor laser element is integrated of: a plurality of semiconductor lasers of distributed feedback type that oscillate in single mode at emission wavelengths different from each other; an optical coupler that has as many input ports as the plurality of semiconductor lasers, the input ports to which output light from the plurality of semiconductor lasers are input, the optical coupler guiding and outputting the output light; and a semiconductor optical amplifier that amplifies the output light from the optical coupler. The following relation (1) holds true, where "N" is the number of the plurality of semiconductor lasers, "Ldfb" is a cavity length of each of the plurality of semiconductor lasers, "Δν0" is a spectral linewidth of laser light output therefrom, "Lsoa" is an amplifier length of the semiconductor optical amplifier, "A" is an amplification factor of the semiconductor optical amplifier, "Δν" is a spectral linewidth of amplified laser light output therefrom, and "R" is Δν/Δν0:

$$\frac{Lsoa}{Ldfb} \leq (R-1) \cdot N \cdot 1.44 \cdot A^{-0.74} \quad (1)$$

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
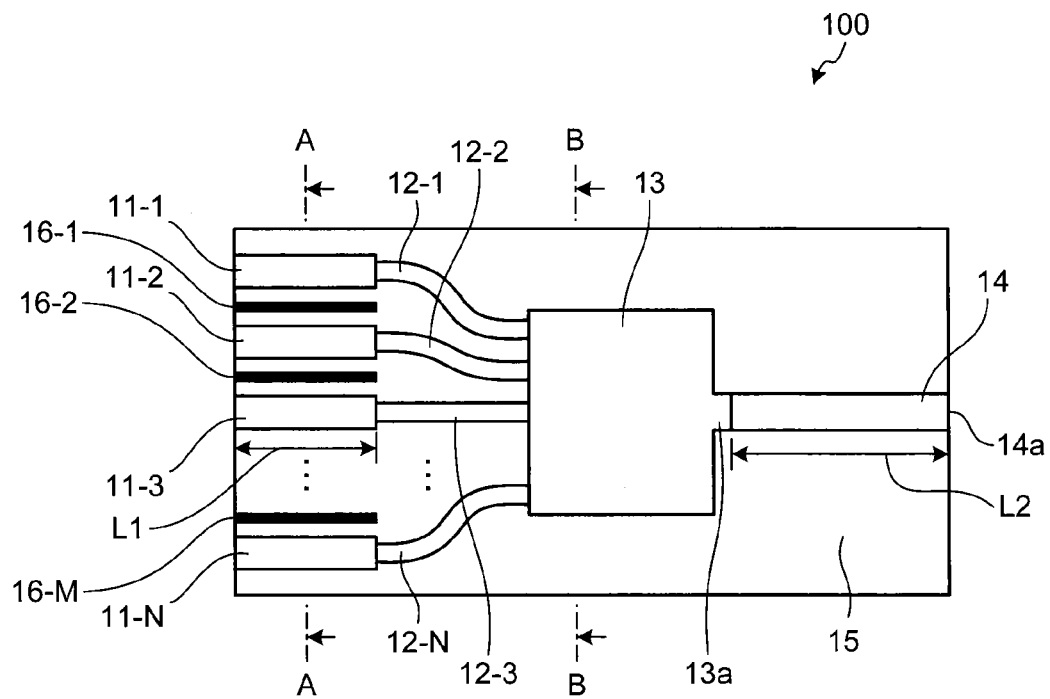
FIG. 1 is a schematic plan view of an integrated semiconductor laser element according to an embodiment.

An embodiment of an integrated semiconductor laser element according to the present invention will be described in detail with reference to the drawings. The invention is not limited by the embodiment. In the respective drawings, the same or corresponding components are appended with the same reference numerals or symbols as appropriate. Furthermore, it is to be noted that the drawings are schematic, and relations between thicknesses and widths of respective layers, ratios among respective layers, and the like may differ from the actual. Portions having different relations or ratios among their dimensions among the drawings may also be included.

Embodiment

FIG. 1 is a schematic plan view of an integrated semiconductor laser element according to an embodiment. As illustrated in FIG. 1, an integrated semiconductor laser element 100 according to this embodiment has a structure in which: DFB lasers 11-1 to 11-N as many as N (where N is an integer of 2 or greater); optical waveguides 12-1 to 12-N as many as N; an optical coupler 13; and a semiconductor optical amplifier (SOA) 14, each having a mesa structure, are integrated on a semiconductor substrate, and are embedded by an embedding portion 15. In the embedding portion 15 between the DFB lasers 11-1 to 11-N, trenches 16-1 to 16-M (where M=N−1) are provided.

Each of the DFB lasers 11-1 to 11-N is an edge emitting laser having a striped embedded structure of a width of 1.5 micrometers to 3 micrometers, and is formed at one end of the integrated semiconductor laser element 100 at a pitch of, for example, 25 micrometers in a width direction. Each of the DFB lasers 11-1 to 11-N is configured, by making spacings of diffraction gratings provided in these DFB lasers different from one another, such that output light becomes laser light of single-mode oscillation and their laser emission wavelengths differ from one another within a range of approximately 1530 nanometers to 1570 nanometers. Furthermore, an emission wavelength of each of the DFB lasers 11-1 to 11-N is finely adjustable by varying a set temperature of the integrated semiconductor laser element 100. That is, the integrated semiconductor laser element 100 achieves a wide variable wavelength range by the switching of the DFB lasers to be driven and the temperature control.

The range of the fine adjustment of the laser emission wavelength by the temperature adjustment for each of the DFB lasers 11-1 to 11-N is preferably about 3 nanometers or less. Consequently, to cover a wavelength range of approximately 1530 nanometers to 1570 nanometers, the number of the DFB lasers 11-1 to 11-N is preferably 12 or greater, for example, 16. However, the value of N is not particularly limited. Furthermore, the range of emission wavelengths of the DFB lasers 11-1 to 11-N may be, for example, approximately 1570 nanometers to 1610 nanometers.

In FIG. 1, length L1 represents a cavity length Ldfb of the DFB lasers 11-1 to 11-N. The cavity length will be described later in detail.

Figure 2:
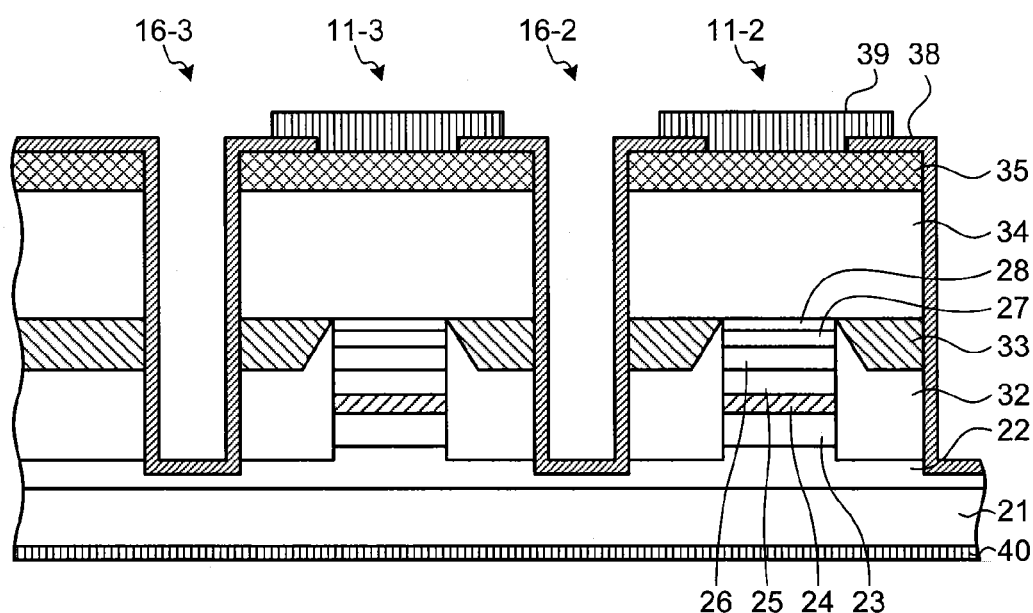
FIG. 2 is a diagram illustrating a part of a cross section along line A-A of the integrated semiconductor laser element depicted in FIG. 1.

FIG. 2 is a diagram illustrating a part of a cross section along line A-A of the integrated semiconductor laser element 100 depicted in FIG. 1. As illustrated in FIG. 2, the DFB laser 11-2, for example, includes: an n-type InP buffer layer 22 provided also as a lower cladding; a lower InGaAsP separate confinement heterostructure (SCH) layer 23 with its composition consecutively varied therein; an active layer 24 of a multi-quantum well (MQW) structure; an upper InGaAsP-SCH layer 25; an InP spacer layer 26; a grating layer 27 formed of InGaAsP or AlGaInAs; and a p-type InP layer 28, which are sequentially laminated on an n-type InP substrate 21. In the grating layer 27, a diffraction grating is formed.

Layers from the p-type InP layer 28 to a part of the n-type InP buffer layer 22 have a striped mesa structure. This mesa structure is embedded by a p-type InP embedding layer 32 and an n-type InP current blocking layer 33. On the p-type InP layer 28 and the n-type InP current blocking layer 33, a p-type InP cladding layer 34 and an InGaAs contact layer 35 are sequentially laminated. An outer surface of each semiconductor layer is protected by a SiN protective film 38. Furthermore, a part of the SiN protective film 38 has an opening on the InGaAs contact layer 35. In this opening, a p-side electrode 39 is formed. On a reverse surface of the n-type InP substrate 21, an n-side electrode 40 is formed.

The active layer 24 has a plurality of alternately laminated well layers and barrier layers. The well layers and the barrier layers are composed of a GaInAsP semiconductor material or an AlGaInAs semiconductor material. A composition of the active layer 24 is set so as to have a gain peak wavelength near the middle of 1530 nanometers to 1570 nanometers for example, which is a bandwidth corresponding to the emission wavelengths of the DFB lasers 11-1 to 11-N, i.e., near 1550 nanometers. The gain peak wavelength of the semiconductor laser according to this setting of the composition is that at 10° C. to 50° C., which is an operating temperature of the integrated semiconductor laser element 100. A width of the active layer 24 is, for example, 1.4 micrometers to 1.7 micrometers. The other DFB lasers 11-1, and 11-3 to 11-N have approximately the same structure as the DFB laser 11-2, including the composition and thickness of the active layer.

Figure 3:
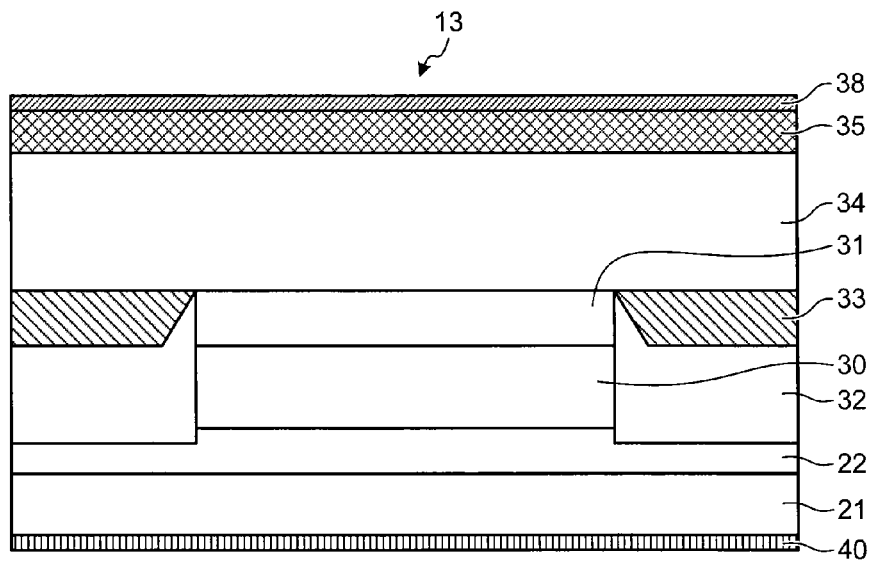
FIG. 3 is a cross-sectional view of the integrated semiconductor laser element depicted in FIG. 1 along line B-B.

The optical coupler 13 is a multi-mode interferometer (MMI) optical coupler having input ports as many as N and one output port. FIG. 3 is a cross-sectional view of the integrated semiconductor laser element depicted in FIG. 1 along line B-B. As illustrated in FIG. 3, the optical coupler 13 has an embedded mesa structure similar to that of the DFB lasers 11-1 to 11-N, but has a laminated structure of an InGaAsP core layer 30 and an i-type InP layer 31 in place of the laminated structure of the lower InGaAsP-SCH layer 23 to the p-type InP layer 28. Furthermore, the optical coupler 13 has a mesa width formed more widely than that of the DFB lasers 11-1 to 11-N. In the optical coupler 13, the opening of the SiN protective film 38 and the p-side electrode 39 are not formed.

The optical coupler 13 is not limited to the MMI optical coupler, and may be of another N×1 optical coupler, such as a Fresnel coupler for example.

The optical waveguides 12-1 to 12-N are formed between the DFB lasers 11-1 to 11-N and the optical coupler 13, have an embedded mesa structure similar to that of the optical coupler 13, and optically connect the DFB lasers 11-1 to 11-N and N input ports of the optical coupler 13.

The SOA 14 connects to a single output port 13a of the optical coupler 13. The SOA 14 has an embedded mesa structure similar to that of the DFB lasers 11-1 to 11-N. However, the SOA 14 is different from the DFB lasers 11-1 to 11-N, not having the grating layer 27, but having a p-type InP layer formed therein instead. In the SOA 14, a width of the active layer is, for example, 1.4 micrometers to 1.7 micrometers, but is not particularly limited as long as the width allows the laser beam output by the DFB lasers 11-1 to 11-N to be guided in single mode.

In FIG. 1, length L2 represents a length of the SOA 14 (amplifier length) Lsoa. The amplifier length will be described later in detail.

Next, operations of the integrated semiconductor laser element 100 will be described. First, one DFB laser selected from the DFB lasers 11-1 to 11-N is driven to output single-mode laser light of a desired wavelength. The trenches 16-1 to 16-M electrically isolate among the DFB lasers 11-1 to 11-N making separating resistances among the DFB lasers large, and it becomes easy to select and drive one of the DFB lasers 11-1 to 11-N.

Next, from among the plurality of optical waveguides 12-1 to 12-N, the optical waveguide optically connected to the DFB laser driven guides the laser light from the DFB laser driven, in single mode. The optical coupler 13 makes the laser light guided through the optical waveguide pass therethrough and outputs the laser light from the output port 13a. The SOA 14 amplifies the laser light output from the output port 13a and outputs the laser light to the outside of the integrated semiconductor laser element 100 from an output end 14a. The SOA 14 is used to compensate for an optical loss caused by the optical coupler 13 in the laser light from the DFB laser driven, and to obtain a desired optical power intensity from the output terminal 14a. When the optical coupler 13 has N input ports and one output port, the intensity of the laser light from the DFB laser driven is attenuated to about one N-th by the optical coupler 13.

The spectral linewidth of the laser light output by the DFB laser driven varies depending on the cavity length Ldfb of the DFB laser and the coupling coefficient κ of the diffraction grating. More specifically, making Ldfb longer or making κ greater allows the spectral linewidth to be narrower.

Figure 4:
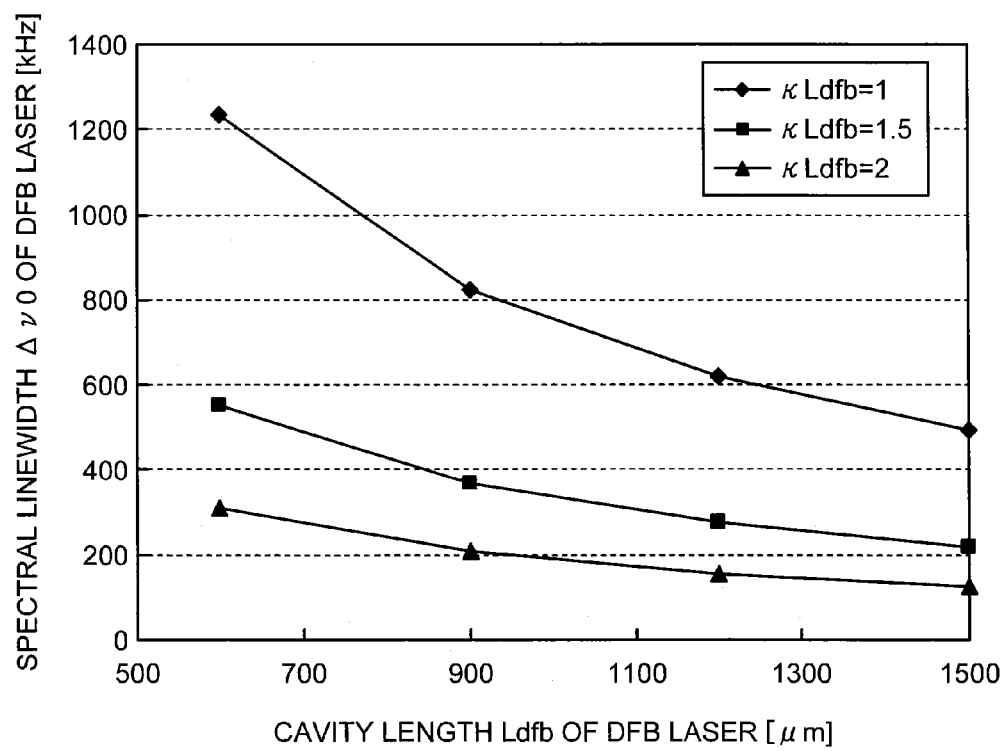
FIG. 4 is a diagram illustrating an example of relations between cavity lengths Ldfb of DFB lasers and spectral linewidth $\Delta v0$ of single DFB lasers.

FIG. 4 is a diagram illustrating an example of relations between cavity lengths Ldfb of DFB lasers and spectral linewidth Δv0 of single DFB lasers. FIG. 4 illustrates cases in which a driving current is set so that an optical power intensity of laser light output becomes 20 milliwatts in the DFB laser having the structure of FIG. 2.

As illustrated in FIG. 4, even though the intensities of the laser light output are the same, the spectral linewidth Δv0 become narrower as values of Ldfb become larger. Furthermore, the spectral linewidth Δv0 becomes narrower as κLdfb becomes greater. As a consequence, appropriately adjusting κ for various values of Ldfb allows a desired spectral linewidth Δv0 to be obtained. However, κLdfb is preferably set to about 1.5 because multi-mode oscillation may occur in the DFB laser if κLdfb is set large.

Next, a relation between the amplifier length Lsoa of the SOA 14 and the cavity length Ldfb of the DFB lasers 11-1 to 11-N will be described. In the integrated semiconductor laser element 100 according to the embodiment, Lsoa and Ldfb are set to satisfy the following expression (1):

$$\frac{Lsoa}{Ldfb} \le (R-1) \cdot N \cdot 1.44 \cdot A^{-0.74} \quad (1)$$

In this expression, "N" represents the number of the DFB lasers 11-1 to 11-N, or the number of the input ports of the optical coupler 13. "A" represents an amplification factor of the SOA 14. Furthermore, "Δv0" represents the spectral linewidth of the laser light output from the DFB lasers 11-1 to 11-N, Δv represents the spectral linewidth of the amplified laser light output from the output end 14a of the SOA 14, and "R" is Δv/Δv0.

According to a careful examination performed by the inventors on characteristics of spectral linewidth of the integrated semiconductor laser element 100, as long as Lsoa and Ldfb satisfy expression (1), Δv/Δv0, which is a ratio between the spectral linewidth Δv0 of the laser light output from the DFB lasers 11-1 to 11-N and the spectral linewidth Δv of the amplified laser light output from the output end 14a of the SOA 14, becomes a desired value or less. Accordingly, widening of the spectral linewidth of the laser light caused by the SOA 14 is suppressed to a desired value or less with respect to the original spectral linewidth. While R is not particularly limited as long as R is of a value larger than 1, it is preferably 4 or less for a narrow linewidth, and is preferably 2, for example.

Specific description will be made below. First, the inventors experimentally fabricated integrated semiconductor laser elements having different numbers of DFB lasers and different amplifier lengths Lsoa of their SOAs, by setting a cavity length of the DFB lasers to 600 micrometers, 900 micrometers, 1200 micrometers, or 1500 micrometers, and setting κ so that a spectral linewidth Δv0 becomes 250 kHz when an intensity of laser light output is 20 milliwatts. The inventors then examined the spectral linewidth Δv of the amplified laser light output from the output end of the SOA when the integrated semiconductor laser element was operated while changing the amplification factor "A" by varying the driving current of the SOA.

Figure 5:
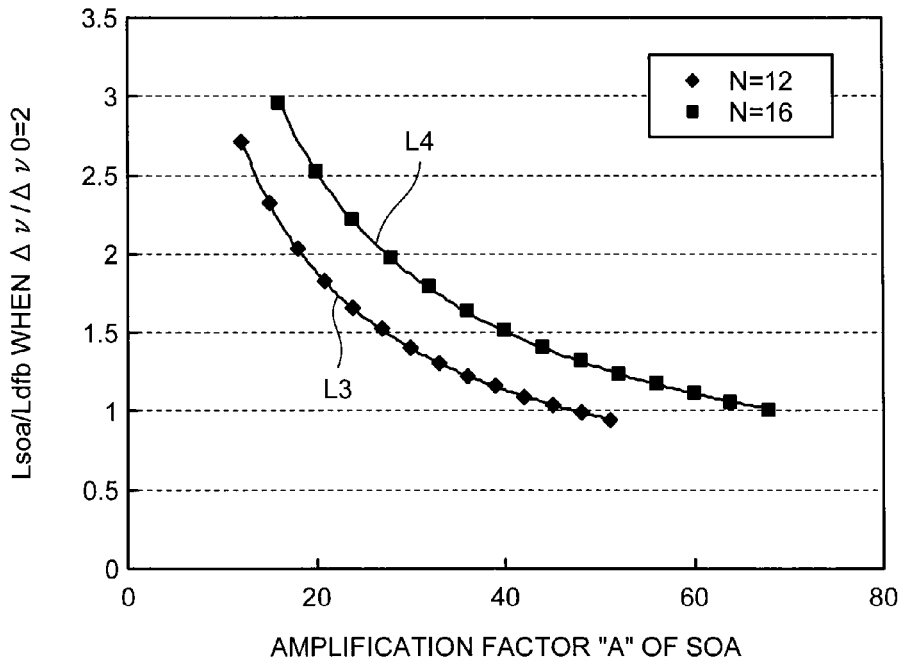
FIG. 5 is a diagram illustrating relations between amplification factors "A" of SOAs and Lsoa/Ldfb when R=$\Delta v$/$\Delta v0$=2.

FIG. 5 is a diagram illustrating relations between amplification factors "A" of SOAs and Lsoa/Ldfb when R=Δv/Δv0=2. FIG. 5 illustrates examples in which N is 12 and 16. Rhombic symbols represent data when N is 12. Square symbols represent data when N is 16. In FIG. 5, lines L3 and L4 are the curves for N=12 and N=16, respectively, when the equality in expression (1) holds true.

As illustrated in FIG. 5, for both examples in which Ns are 12 and 16, the relation between Lsoa/Ldfb and the amplification factor "A" when Δv/Δv0=2 was confirmed to be expressed by expression (1) where R=2 and the equality thereof holds true. Furthermore, when the relation between the amplification factor "A" of SOA and Lsoa/Ldfb was examined when R is of a value of greater than 1 and other than 2, for both examples, the relation between Lsoa/Ldfb and the amplification factor "A" when Δv/Δv0=R was confirmed to be expressed by expression (1) where the equality thereof holds true. Consequently, setting the relation of Lsoa/Ldfb according to expression (1) allows the spectral linewidth of the laser light to be of a desired narrow value.

As described above, when κL is set so that the spectral linewidth Δv0 of the laser light output by the DFB laser becomes 250 kHz or less, by applying the relation of expression (1) where R=2, the spectral linewidth Δv of the amplified laser light output from the output end of the SOA is able to be made 500 kHz or less. As a consequence, an integrated semiconductor laser element preferable for application as a signal light source for a digital coherent transmission use or as a local light source used in a receiver is able to be realized.

Next, characteristics of integrated semiconductor laser elements in which a cavity length Ldfb of DFB lasers is set to 600 micrometers, 900 micrometers, 1200 micrometers, or 1500 micrometers, κ is set so that the spectral linewidth Δv0 becomes 250 kHz when an intensity of laser light output is 20 milliwatts, the number of DFB lasers is set to twelve, and an amplifier length Lsoa of the SOA is set to 1400 micrometers.

Figure 6:
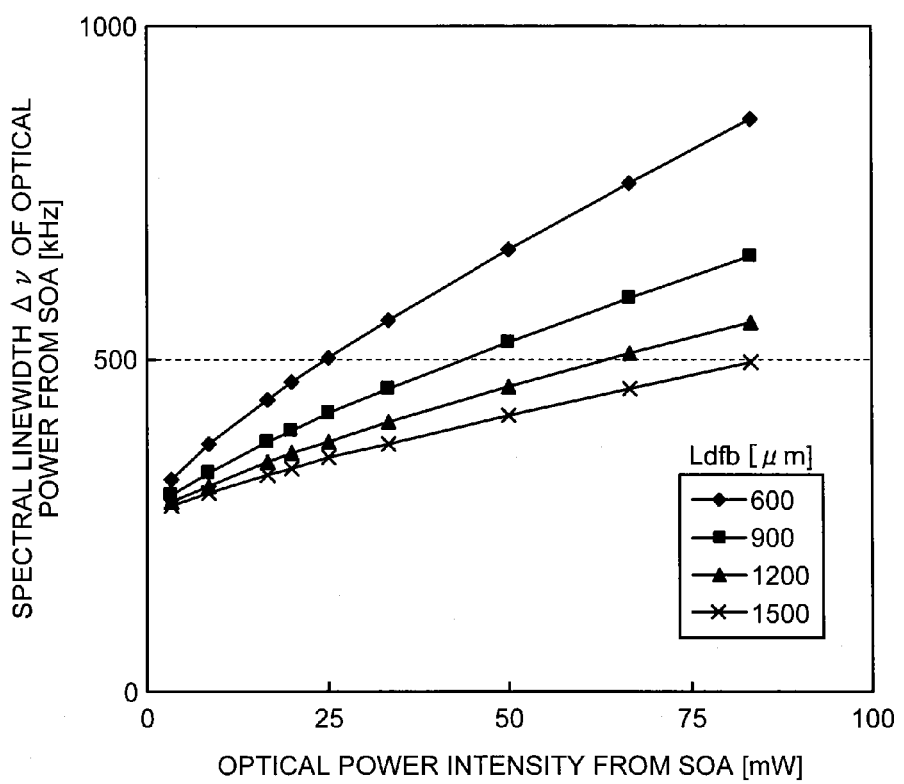
FIG. 6 is a diagram illustrating relations between optical power intensities from SOAs and spectral linewidth $\Delta v$ of optical power intensities from the SOAs.

FIG. 6 is a diagram illustrating relations between optical power intensities from the SOAs and the spectral linewidth Δv of optical power intensities from the SOAs. As illustrated in FIG. 6, as the optical power intensity from the SOA becomes higher, that is, as the amplification factor "A" of the SOA becomes larger, the spectral linewidth Δv becomes wider. However, even though the spectral linewidth Δv0 was set to the same 250 kHz, the widening of the spectral linewidth Δv0 in the SOA is suppressed more when the cavity length Ldfb of the DFB lasers is longer.

Figure 7:
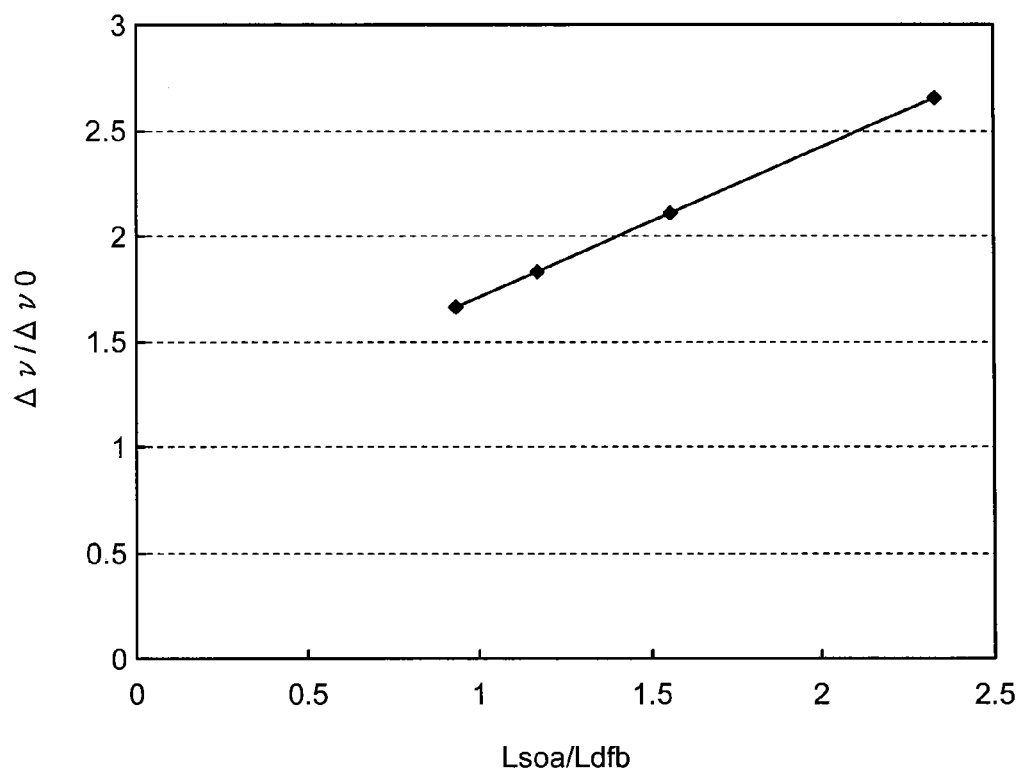
FIG. 7 is a diagram illustrating a relation between Lsoa/Ldfb and $\Delta v/\Delta v0$ for the examples illustrated in FIG. 6.

FIG. 7 is a diagram illustrating a relation between Lsoa/Ldfb and Δv/Δv0 for the examples illustrated in FIG. 6. The optical power intensity from the SOA is 50 milliwatts. If the optical power intensity from the SOA is 50 milliwatts or greater, when configuring a laser module, even if a coupling loss upon coupling optical power from the SOA to the pig-tail fiber of about 1 dB is assumed, the optical power intensity from the pig-tail fiber is able to be made 40 milliwatts or greater. Consequently, an integrated semiconductor laser element and a laser module that are preferable for application as a signal light source for digital coherent transmission are able to be realized.

When the values of Ldfb are 600 micrometers, 900 micrometers, 1200 micrometers, and 1500 micrometers, the values of Lsoa/Ldfb are 2.33, 1.56, 1.17, and 0.93, respectively. Under the conditions of FIG. 7, when the values of Ldfb are 1200 micrometers and 1500 micrometers, expression (1) where R=2 is satisfied and thus Δv/Δv0 becomes 2 or less as illustrated in FIG. 7, and Δv0 becomes 500 kHz or less. In contrast, when the values of Ldfb are 600 micrometers and 900 micrometers, expression (1) where R=2 is not satisfied and thus Δv/Δv0 becomes greater than 2 as illustrated in FIG. 7 and Δv0 becomes greater than 500 kHz. Under the conditions of FIG. 7, as indicated by an approximate straight line of data points, Lsoa/Ldfb is preferably approximately 1.4 or less as Δv/Δv0 then becomes 2 or smaller.

As described above, in the integrated semiconductor laser element 100 having N DFB lasers 11-1 to 11-N according to the embodiment, the required amplification factor "A" of the SOA 14 is determined in order to obtain a necessary optical power intensity of laser light. At this time, setting Lsoa/Ldfb to satisfy the relation expressed by expression (1) makes the ratio Δv/Δv0 to be of a desired value or less at the necessary power intensity and thus a wavelength variable laser that is capable of outputting laser light of a high intensity and a narrow linewidth is able to be realized.

When the cavity length Ldfb of the DFB lasers 11-1 to 11-N is short, setting κLdfb large (that is, setting κ large) to obtain narrow linewidth characteristics lowers the probability of single-mode oscillation. This deteriorates the yield rate of the integrated semiconductor laser element 100 and the cost is increased. In view of the above, Ldfb is preferably equal to or greater than 1200 micrometers. Furthermore, Ldfb is preferably large, because the spectral linewidth Δv0 is not likely to be increased even if the amplification factor "A" of the SOA 14 is increased. Moreover, as illustrated in FIG. 4, in the example in which κLdfb=1.5 and single-mode characteristics are high, the effect of reducing the spectral linewidth Δv0 is not sufficiently obtainable even if Ldfb is larger than 1500 micrometers. In view of the above, by making Ldfb equal to or less than 1500 micrometers, a desired spectral linewidth is obtainable without increasing the area of the integrated semiconductor laser element 100 more than necessary. This makes it possible to increase the number of integrated semiconductor laser elements obtainable from a single wafer and reduce the manufacturing cost.

Furthermore, as the cavity length of the DFB lasers 11-1 to 11-N becomes longer, the current-light conversion efficiency (W/A) becomes lower. This may cause the driving current of the DFB lasers 11-1 to 11-N for obtaining a desired spectral linewidth to be increased and an increase in power consumption. In this case, narrowing of a mesa width (or a width of the active layer 24) of the DFB lasers 11-1 to 11-N increases the current density of the current injected in the active layer 24. This is thus preferable as it suppresses the lowering of the current-light conversion efficiency. The width of the active layer 24 is preferably, for example, 1.7 micrometers or less as described above. Narrowing the width of the active layer 24 is not only preferable for narrowing the linewidth of the laser beam, but also is able to improve SMSR. However, if the width of the active layer is made too narrow, the electrical resistance of the DFB laser element is increased, and thus the element characteristics may be deteriorated by heat generation. To avoid this, the width of the active layer 24 is preferably 1.4 micrometers or greater.

Further, as described above, while κLdfb in the DFB lasers 11-1 to 11-N is preferably set to about 1.5, κLdfb is preferably, for example, 1.3 to 1.65.

Figure 8:
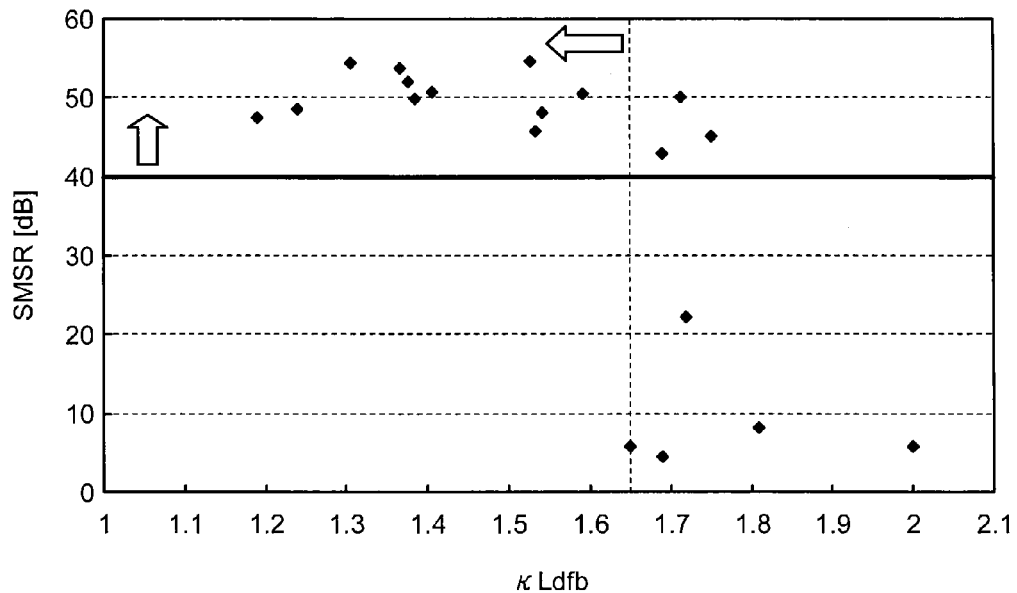
FIG. 8 is a diagram illustrating a relation between $\kappa$Ldfb and SMSR of DFB lasers.

FIG. 8 is a diagram illustrating a relation between κLdfb and SMSR of DFB lasers. FIG. 8 illustrates a case in which, in the DFB lasers having the structure of FIG. 2, a driving current is set so that an intensity of laser light becomes 20 milliwatts.

For favorable single-mode oscillation characteristics, generally, SMSR is preferably 40 dB or greater. As illustrated in FIG. 8, as κLdfb becomes 1.65 or greater, some DFB lasers have their SMSRs decreased, and the yield rate of single-mode oscillation is decreased. Thus, κLdfb is preferably 1.65 or less.

Figure 9:
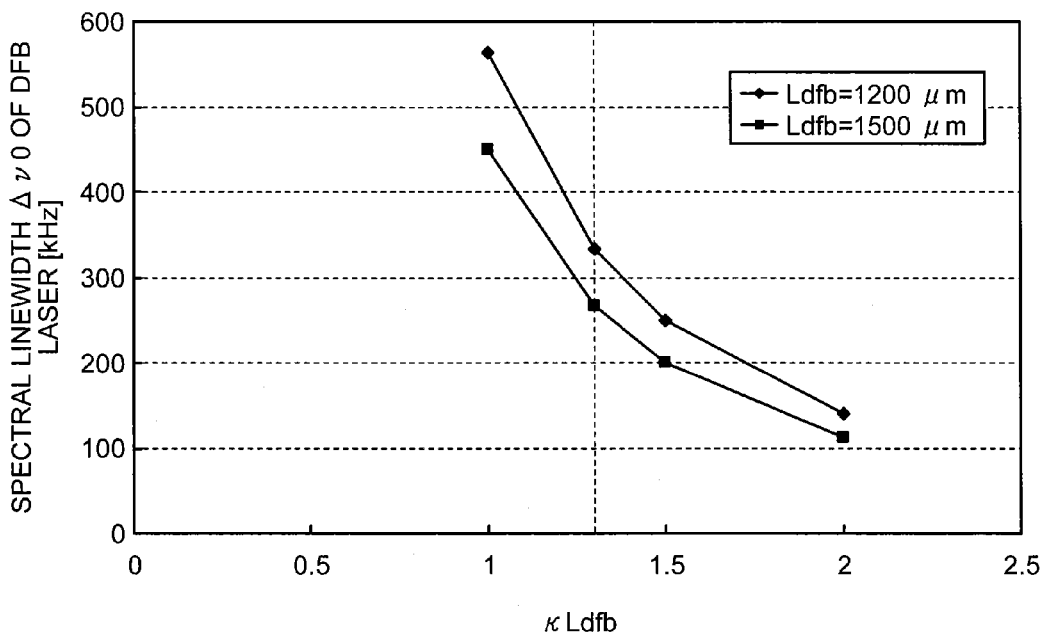
FIG. 9 is a diagram illustrating relations between $\kappa$Ldfb of DFB lasers and spectral linewidth $\Delta v0$ of single DFB lasers.

FIG. 9 is a diagram illustrating relations between κLdfb of DFB lasers and spectral linewidth Δv0 of single DFB lasers. FIG. 9 also illustrates a case in which, in the DFB lasers having the structure of FIG. 2, the driving current is set so that the intensity of the laser light becomes 20 milliwatts.

As illustrated in FIG. 9, when the values of Ldfb are 1200 micrometers and 1500 micrometers, as κLdfb becomes 1.3 or less, Δv0 increases sharply. Thus, κLdfb is preferably 1.3 or greater. Accordingly, κLdfb is preferably 1.3 to 1.65 for realizing both favorable single-mode oscillation characteristics and narrow linewidth characteristics.

According to an embodiment of the present invention, an integrated semiconductor laser element that is capable of outputting laser light of a desired spectral linewidth and a desired optical intensity is able to be realized.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An integrated semiconductor laser element, comprising and integrated of:

a plurality of semiconductor lasers of distributed feedback type that oscillate in single mode at emission wavelengths different from each other;

an optical coupler that has as many input ports as the plurality of semiconductor lasers, the input ports to which output light from the plurality of semiconductor lasers are input, the optical coupler guiding and outputting the output light; and a semiconductor optical amplifier that amplifies the output light from the optical coupler, wherein the following relation (1) holds true, where "N" is the number of the plurality of semiconductor lasers, "Ldfb" is a cavity length of each of the plurality of semiconductor lasers, "Δv0" is a spectral linewidth of laser light output therefrom, "Lsoa" is an amplifier length of the semiconductor optical amplifier, "A" is an amplification factor of the semiconductor optical amplifier, "Δv" is a spectral linewidth of amplified laser light output therefrom, and "R" is Δv/Δv0:

$$\frac{Lsoa}{Ldfb} \le (R-1) \cdot N \cdot 1.44 \cdot A^{-0.74}. \tag{1}$$

2. The integrated semiconductor laser element according to claim 1, wherein in each of the plurality of semiconductor lasers, a value of a product of a coupling coefficient of a diffraction grating in the each of the plurality of semiconductor lasers and the cavity length is set so that the spectral linewidth of the output light from the each of the plurality of semiconductor lasers becomes 250 kHz or less, and "R" is 2.

3. The integrated semiconductor laser element according to claim 1, wherein the cavity length of each of the plurality of semiconductor lasers is 1200 micrometers or greater.

4. The integrated semiconductor laser element according to claim 1, wherein a product of a coupling coefficient of a diffraction grating in each of the plurality of semiconductor lasers and the cavity length is approximately 1.5.

5. The integrated semiconductor laser element according to claim 1, wherein an intensity of the output light from the semiconductor optical amplifier is 50 milliwatts or greater.

* * * * *